(12) United States Patent
Hong et al.

(10) Patent No.: US 9,517,486 B2
(45) Date of Patent: *Dec. 13, 2016

(54) VALVE IMPACT TYPE DISPENSING PUMP

(71) Applicant: PROTEC CO., LTD., Incheon (KR)

(72) Inventors: Seung Min Hong, Incheon (KR); Il Kang, Gwangju (KR)

(73) Assignee: PROTEC CO., LTD., Incheon (KR)

( * ) Notice: Subject to any disclaimer, the term of this patent is extended or adjusted under 35 U.S.C. 154(b) by 49 days.

This patent is subject to a terminal disclaimer.

(21) Appl. No.: 14/599,795

(22) Filed: Jan. 19, 2015

(65) Prior Publication Data

US 2015/0136302 A1    May 21, 2015

Related U.S. Application Data

(63) Continuation of application No. 13/725,585, filed on Dec. 21, 2012, now Pat. No. 8,955,724.

(30) Foreign Application Priority Data

May 24, 2012    (KR) ................. 10-2012-0055123

(51) Int. Cl.
*B05C 5/02* (2006.01)
*B05B 1/30* (2006.01)
*B32B 37/12* (2006.01)
*B32B 38/00* (2006.01)
*H05K 13/04* (2006.01)

(52) U.S. Cl.
CPC ........... *B05C 5/0225* (2013.01); *B05B 1/3013* (2013.01); *B32B 37/1284* (2013.01); *B32B 38/00* (2013.01); *H05K 13/0469* (2013.01); *B32B 2038/0076* (2013.01); *B32B 2457/00* (2013.01); *Y10T 156/10* (2015.01); *Y10T 156/1798* (2015.01)

(58) Field of Classification Search
CPC ............................ B05B 1/3013; B05C 5/0225
USPC ............................................ 156/60; 239/584
See application file for complete search history.

(56) References Cited

U.S. PATENT DOCUMENTS

| | | |
|---|---|---|
| 3,152,726 A | 10/1964 | Chivers |
| 4,430,886 A | 2/1984 | Rood |
| 5,114,752 A | 5/1992 | Hall |
| 5,255,827 A | 10/1993 | Breault et al. |
| 5,261,610 A | 11/1993 | Waryu et al. |
| 5,505,777 A | 4/1996 | Ciardella et al. |
| 5,671,873 A | 9/1997 | Hammerl et al. |
| 5,711,989 A | 1/1998 | Ciardella et al. |
| 5,747,102 A | 5/1998 | Smith et al. |

(Continued)

FOREIGN PATENT DOCUMENTS

| | | |
|---|---|---|
| KR | 10-2005-0093935 A | 9/2005 |
| KR | 10-2010-0045678 A | 5/2010 |

*Primary Examiner* — Xiao Zhao
(74) *Attorney, Agent, or Firm* — Knobbe Martens Olson & Bear LLP

(57) ABSTRACT

A dispensing pump, and more particularly, a valve impact type dispensing pump that may be used in a process of manufacturing an electronic product and may dispense an accurate amount of a liquid, such as a liquid synthetic resin, at high speed. The valve impact type dispensing pump can descend a valve rod at high speed and thus can dispense a liquid with high viscosity at high speed. The valve impact type dispensing pump can dispense an accurate amount of a liquid at high speed. Also, the valve impact type dispensing pump can dispense a liquid having high viscosity at high speed due to a fast descending speed of a valve rod.

20 Claims, 12 Drawing Sheets

(56) References Cited

U.S. PATENT DOCUMENTS

| | | |
|---|---|---|
| 6,010,740 A | 1/2000 | Rutledge et al. |
| 8,353,429 B2 | 1/2013 | Zhou et al. |
| 2013/0048759 A1 | 2/2013 | Aguilar et al. |

VALVE IMPACT TYPE DISPENSING PUMP

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure relates to a dispensing pump, and more particularly, to a dispensing pump that may be used in a process of manufacturing an electronic product and may dispense an accurate amount of a liquid, such as a liquid synthetic resin, at high speed.

Discussion of Related Technology

Pumps for dispensing liquid are used in various technical fields, such as processes of manufacturing electronic products by using semiconductor chips, and the like.

In particular, dispensing pumps are widely used in an underfill process of a semiconductor process. The underfill process is usually used in a surface mounting technique, such as a flip chip in which a plurality of metal balls are formed on a surface facing a substrate and which electrically connects the substrate and a semiconductor chip via the plurality of metal balls. If a liquid synthetic resin is applied onto a circumference of the semiconductor chip, the resin is dispersed into a space between the semiconductor chip and the substrate by a capillary phenomenon and is filled in a space between the metal balls. The resin that fills the space between the semiconductor chip and the substrate is hardened so that adhesive strength between the semiconductor chip and the substrate can be improved. In addition, the hardened resin serves as a shock absorber and dissipates heat generated in the semiconductor chip.

A function of dispensing a liquid at high speed of such dispensing pumps becomes significant. Korean Patent Laid-open Publication Nos. 10-2005-0093935 and 10-2010-0045678 disclose a structure of a pump for dispensing a resin by ascending/descending a valve due to interaction between a cam and a cam follower. Such dispensing pumps according to the related art have excellent performance but have a limitation in speed at which a valve rod descends due to a structure of cam protrusions of a cam member and a structure of a roller. Thus, there are some difficulties in dispensing the liquid at high speed, and in particular, it is difficult to dispense a liquid with high viscosity at high speed.

SUMMARY

One aspect of the present invention provides a valve impact type dispensing pump that may descend a valve rod at high speed and thus may dispense a liquid with high viscosity at high speed.

Another aspect of the present invention provides a valve impact type dispensing pump including: a pump body; a valve body including an inlet path on which a liquid from an outside is supplied, a reservoir in which the liquid supplied via the inlet path is stored, and a discharge path on which the liquid stored in the reservoir is discharged, the valve body being installed at the pump body; a valve rod pressurizing the liquid stored in the reservoir of the valve body and inserted in the reservoir of the valve body so that the liquid is discharged via the discharge path; an operating rod connected to the valve rod and allowing the valve rod to move relative to the valve body so that a relative motion of the valve rod is allowed within a predetermined distance (gap distance) in a lengthwise direction of the valve rod; a cam member including through hole through which the operating rod passes and cam protrusions formed along a circumferential direction of the cam member based on the through hole and having inclined surfaces formed so that a height of the cam protrusions increases, the cam member being installed at the pump body so that the cam member rotates around the through hole; a rotating unit rotating the cam member; a cam follower including rollers that roll on the inclined surfaces of the cam protrusions when the cam member rotates, the cam follower coupled to the operating rod and allowing the valve rod to move relative to the valve body; and an elastic member installed between the pump body and the cam follower and providing an elastic force to the cam follower so that the cam follower approaches the cam member.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings in which exemplary embodiments of the invention are shown.

Figure 1:
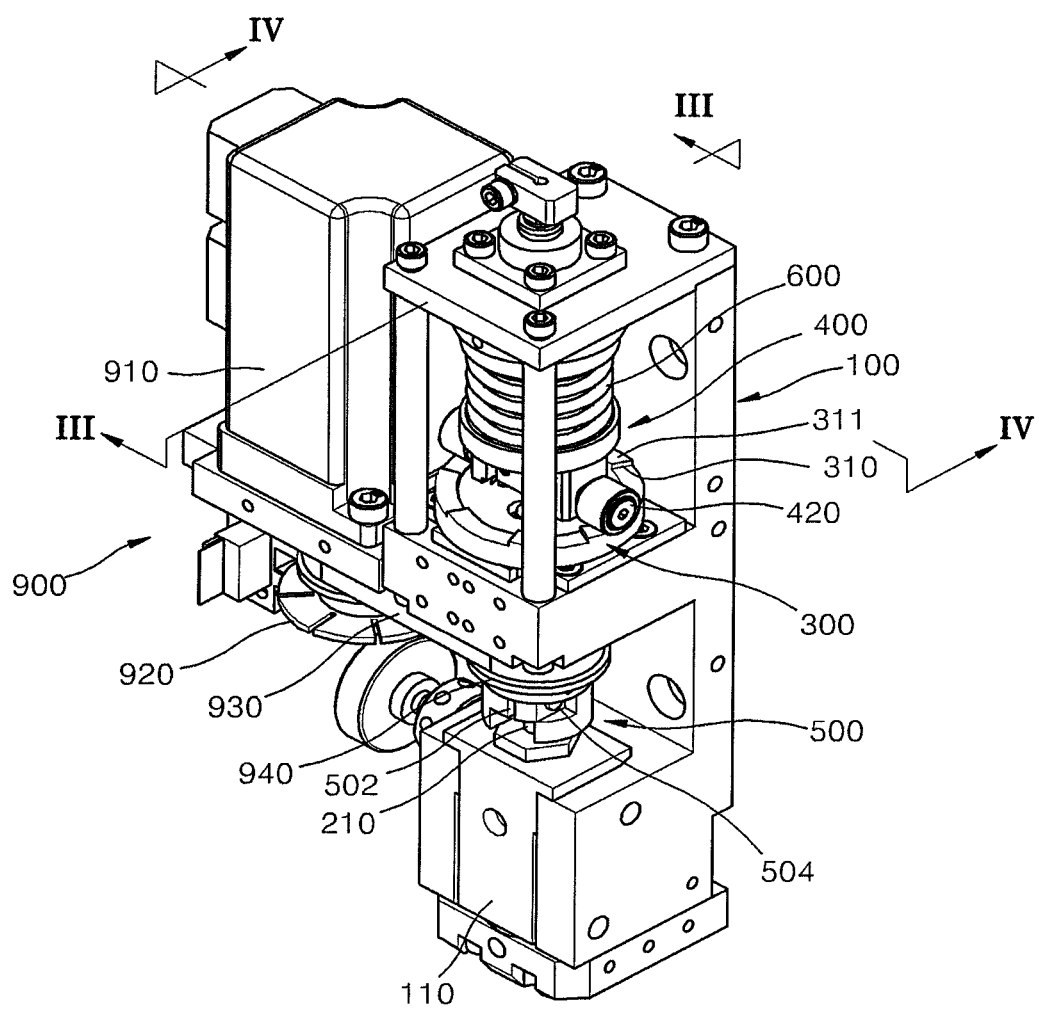
FIG. 1 is a perspective view of a valve impact type dispensing pump according to an embodiment of the present invention.
Figure 2:
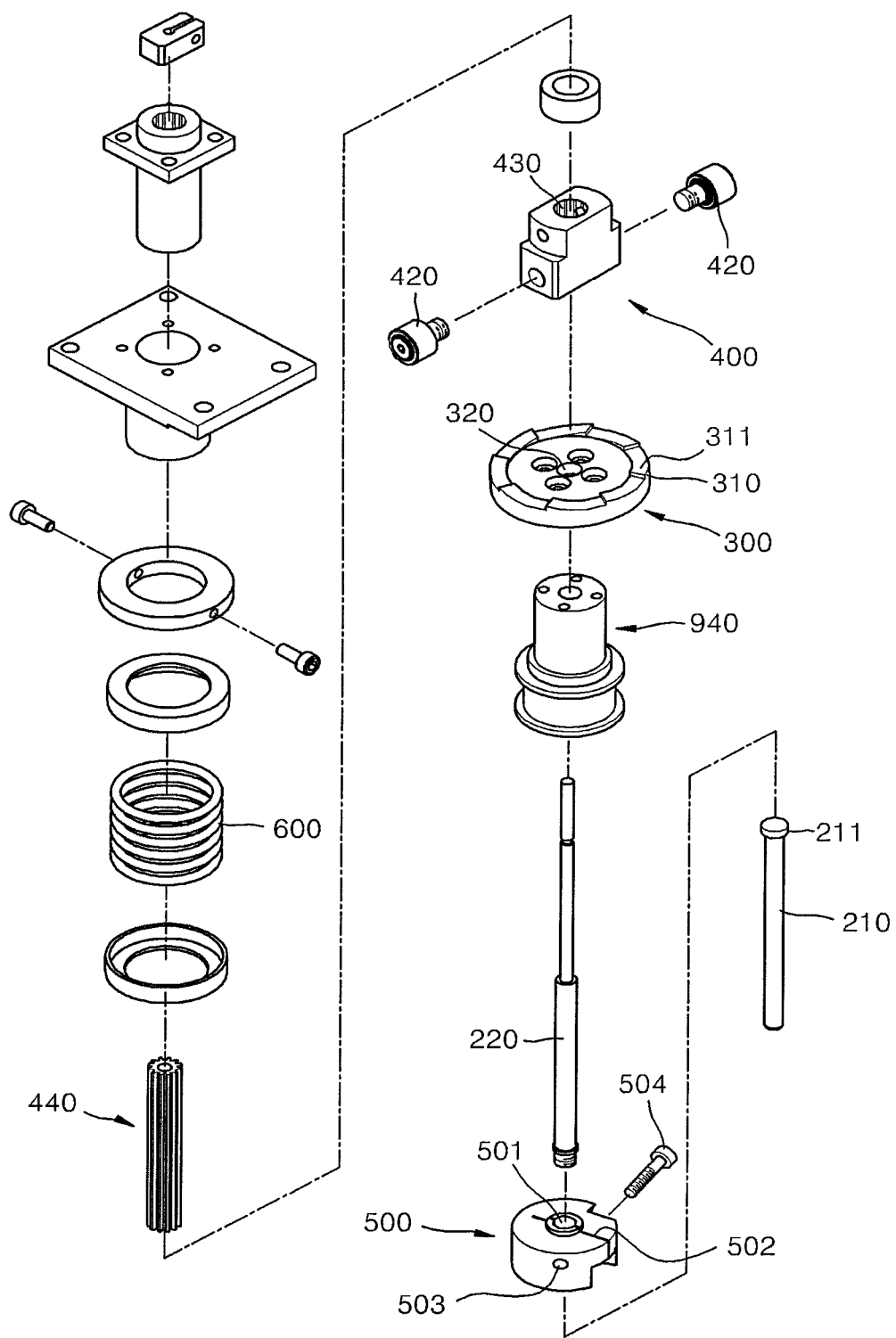
FIG. 2 is an exploded perspective view of main elements of the valve impact type dispensing pump illustrated in FIG. 1.
Figure 3:
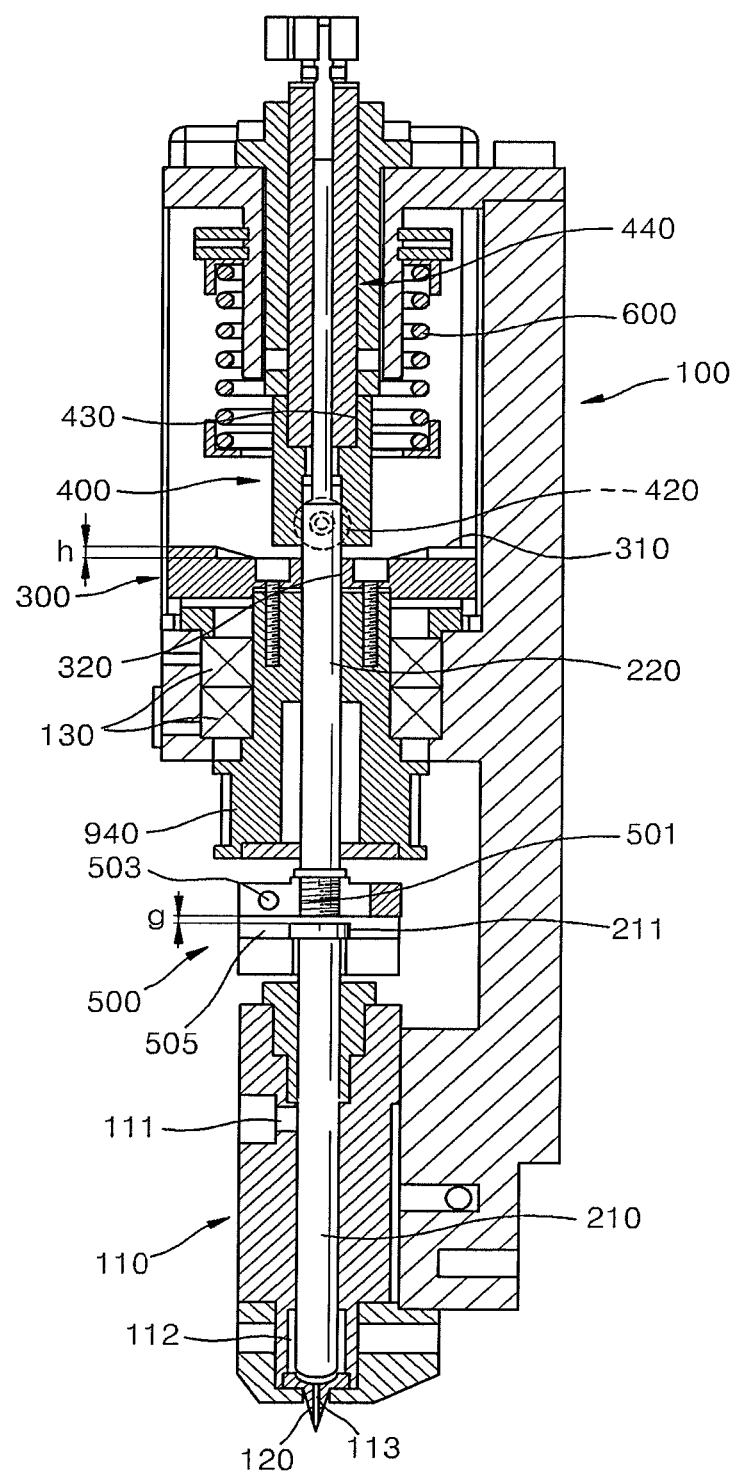
FIG. 3 is a cross-sectional view taken along a line III-III of the valve impact type dispensing pump of FIG. 1.

FIG. 1 is a perspective view of a valve impact type dispensing pump according to an embodiment of the present invention, FIG. 2 is an exploded perspective view of main elements of the valve impact type dispensing pump illustrated in FIG. 1, and FIG. 3 is a cross-sectional view taken along a line III-III of the valve impact type dispensing pump of FIG. 1.

Referring to FIGS. 1 through 3, the valve impact type dispensing pump according to the present embodiment includes a pump body 100, a valve body 110, a valve rod 210, an operating rod 220, a cam member 300, and a cam follower 400.

The pump body 100 serves as a housing that supports the entire structure of the valve impact type dispensing pump. The pump body 100 is installed at a transfer device and is moved by the transfer device to allow a liquid to be dispensed.

The valve body 110 is installed at the pump body 100. The valve body 110 includes an inlet path 111, a reservoir 112, and a discharge path 113. The liquid stored in an external syringe (not shown) flows to the reservoir 112 via the inlet path 111. The liquid stored in the reservoir 112 is discharged via the discharge path 113 due to an operation of the valve rod 210 that ascends/descends with respect to the reservoir 112. A nozzle 120 is connected to the discharge path 113 so as to adjust dispensing characteristics of the liquid.

The valve rod 210 is inserted in the reservoir 112 and pressurizes the liquid stored in the reservoir 112 so as to discharge the liquid via the discharge path 113.

The cam member 300 is disposed above the valve body 110 and the valve rod 210 and is installed at the pump body 100. The cam member 300 is installed at the pump body 100 so as to rotate around a virtual central axis that extends in a lengthwise direction of the valve rod 210. A bearing 130 is installed between the cam member 300 and the pump body 100 so that the cam member 300 may rotate with respect to the pump body 100.

The cam member 300 rotates by a rotating unit 900. The rotating unit 900 includes a motor 910, a driving pulley 920, a timing belt 930, and a driven pulley 940. The motor 910 is installed at the pump body 100, and the driven pulley 940 is installed at the cam member 300. The timing belt 930 connects the driving pulley 920 and the driven pulley 940. If the motor 910 allows the driving pulley 920 to rotate, the driven pulley 940 rotates due to the timing belt 930. As a result, the cam member 300 rotates.

The cam member 300 includes through hole 320 and a plurality of cam protrusions 310. The through hole 320 is formed to penetrate the center of the disc-shaped cam member 300 in a vertical direction. The plurality of cam protrusions 310 are arranged in a circumferential direction of the cam member 300 so that eight cam protrusions 310 are at the same angle intervals (i.e., at intervals of 45 degrees). The cam protrusions 310 are inclined in the same rotation direction along the circumferential direction of the cam member 300. That is, the cam protrusions 310 include inclined surfaces 311 that are inclined so that the height (see h of FIG. 3) of the cam protrusions 310 may increase gradually clockwise, as illustrated in FIG. 2. Cross-sections of the cam protrusions 310 may be formed so that the inclined surfaces 311 are steeply bent from their tops to lower portions. In the present embodiment, the inclined surfaces 311 of the cam protrusions 310 are inclined from their tops in the vertical direction.

The operating rod 220 is disposed in the through hole 320 of the cam member 300 and is connected to the valve rod 210. The operating rod 220 is coupled to the cam follower 400 and ascends or descends so that the valve rod 210 may be moved up and down relative to the valve body 110.

The cam follower 400 faces a surface on which the cam protrusions 310 of the cam member 300 are formed and ascends/descends with respect to the cam member 300 due to interaction between the cam protrusions 310 and the cam follower 400. The cam follower 400 includes two rollers 420 that roll on the inclined surfaces 311 of the cam protrusions 310. Two rollers 420 of the cam follower 400 are disposed at intervals of 180 degrees.

The cam follower 400 is spline-coupled to the pump body 100 via a spline shaft 440 so that an ascending/descending motion of the cam follower 400 may be performed and relative rotation may be prevented. The cam follower 400 includes a spline boss 430 and is coupled to the pump body 100 via the spline shaft 440 so as to make a linear motion (ascending/descending motion in the present embodiment) approaching the cam member 300 and not to allow relative rotation of the cam follower 400.

An elastic member 600 is disposed between the cam follower 400 and the pump body 100 and provides an elastic force so that the cam follower 400 approaches the cam member 300. In the present embodiment, the elastic member 600 having a shape of a spring 600 is used. The cam follower 400 receives the elastic force of the elastic member 600 and is maintained to be closely adhered to the cam member 300.

The valve rod 210 and the operating rod 220 are connected to each other by a gap member 500. The operating rod 220 is screw-coupled to the gap member 500 and is fixed, and the valve rod 210 is connected to the gap member 500 so that a relative motion of the valve rod 210 to the gap member 500 may be allowed at a predetermined distance in a lengthwise direction of the valve rod 210. The relative movable distance between the gap member 500 and the valve rod 210 is referred to as a 'gap distance' g.

Figure 4:
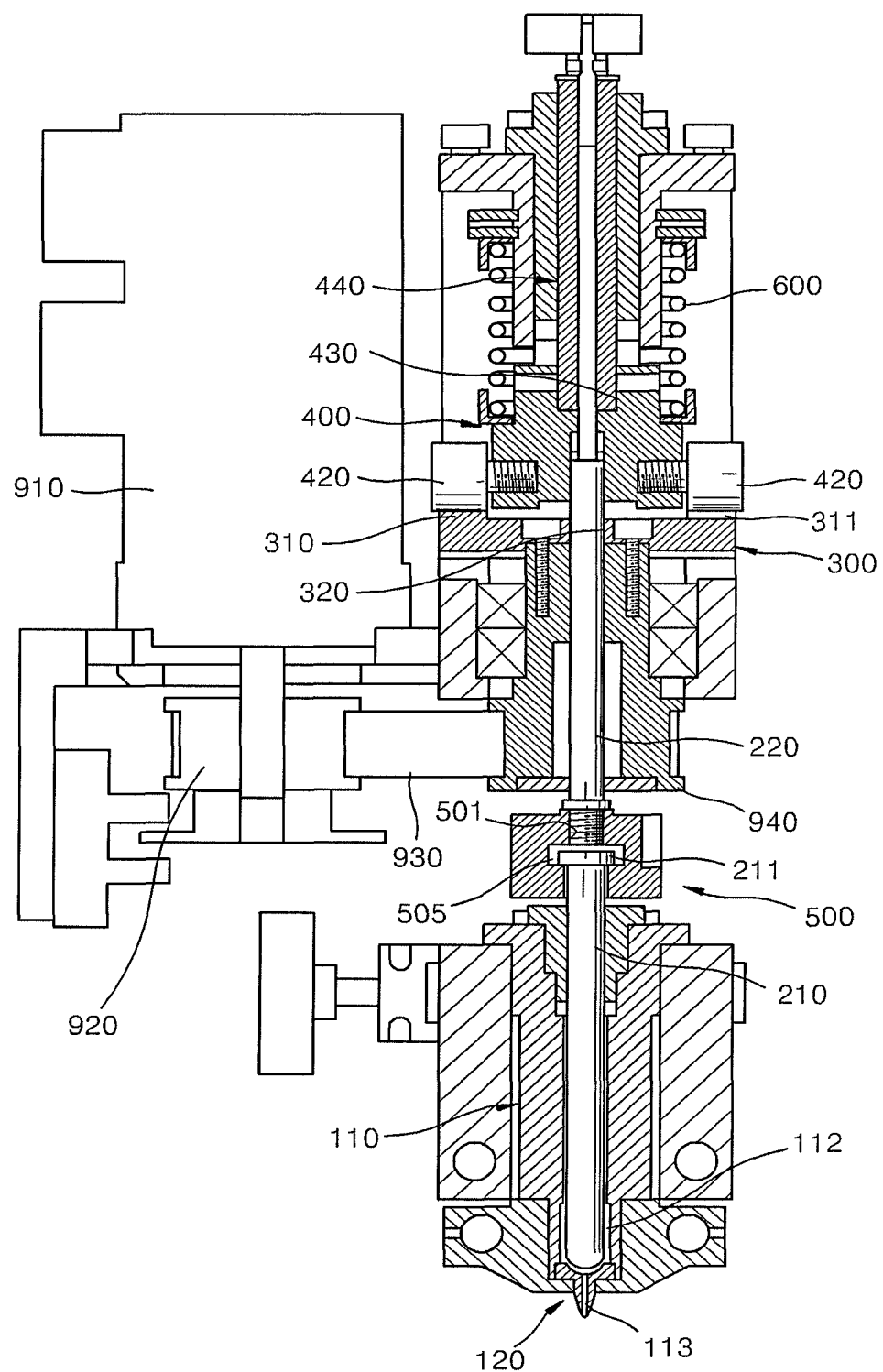
FIG. 4 is a cross-sectional view taken along a line IV-IV of the valve impact type dispensing pump of FIG. 1.

In the present embodiment, the gap member 500 has a structure illustrated in FIGS. 2 through 4. A nut groove 501 is formed in an upper portion of the gap member 500 and is screw-coupled to the operating rod 220. A tightening groove 502 is formed in the gap member 500 to pass through the nut groove 501. A tightening hole 503 is formed in the gap member 500 to perforate the tightening groove 502, and a tightening bolt 504 is screw-coupled to an opposite portion to the tightening hole 503 so as to pressurize the tightening groove 502 to reduce the size of the tightening groove 502 so that screw-coupling between the operating rod 220 and the gap member 500 is not released.

A hanging groove 505 is formed in a lower portion of the gap member 500 and has a T-shape so that the hanging groove 505 is open in a lateral direction of the gap member 500. A hanging protrusion 211 is formed on a top end of the valve rod 210. The hanging protrusion 211 of the valve rod 210 is slid on the hanging groove 505 of the gap member 500 in the lateral direction of the gap member 500 and is engaged therein so that the gap member 500 and the valve rod 210 may be connected to each other. Through the structure, the gap member 500 and the valve rod 210 may be conveniently coupled to or detached from each other. Also, since the valve rod 210 is moved by the operating rod 220 and the gap member 500 only in the vertical direction, the valve rod 210 is not detached from the gap member 500 while the valve rod 210 operates. Only when the operating rod 220 ascends or the valve body 110 is detached from the pump body 100 in order to replace the valve rod 210, the valve rod 210 is moved relative to the gap member 500 in a direction parallel to the hanging groove 505 so that the valve rod 210 may be easily detached from the gap member 500.

Since there is clearance corresponding to the gap distance g between the hanging grove 505 of the gap member 500 and the hanging protrusion 211 of the valve rod 210, as described above, a time difference occurs between the motion of the operating rod 220 and the motion of the valve rod 210. That is, when the operating rod 220 ascends in a state where a bottom surface of the gap member 500 and a top surface of the valve rod 210 contact each other, only the operating rod 220 ascends by the gap distance g in a state where the valve rod 210 stops, and if the hanging groove 505 is caught in the hanging protrusion 211, the operating rod 220 and the valve rod 210 ascend together. When the operating rod 220 descends reversely in this state, only the operating rod 220 descends by the gap distance g in a state where the valve rod 210 stops, and if the hanging groove 505 is caught in the hanging protrusion 211, the operating rod 220 and the valve rod 210 descend together. Through the structure of the hanging protrusion 211 and the hanging groove 505, the gap member 500 is connected to the valve rod 210 to interfere each other with the gap distance g allowed.

Hereinafter, an operation of the valve impact type dispensing pump having the above structure of FIGS. 1 through 3 will be described.

Figure 10A:
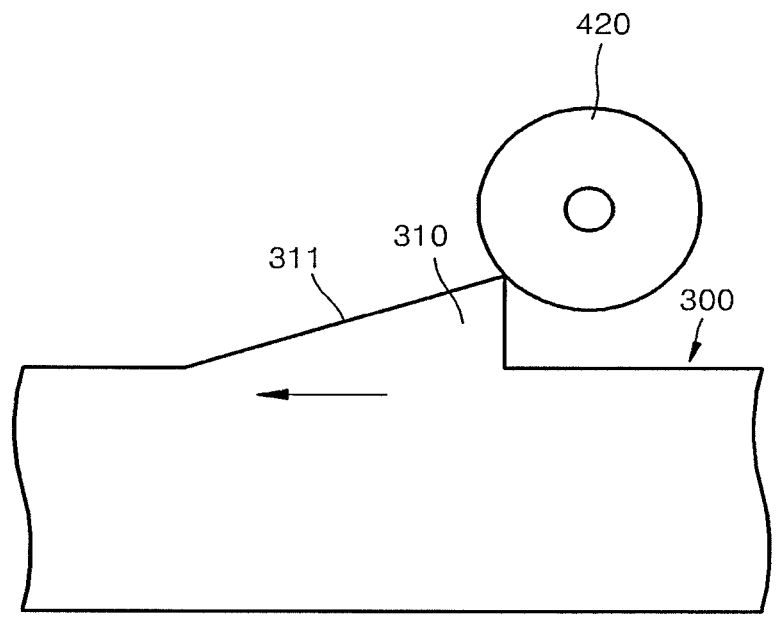
Figure 10B:
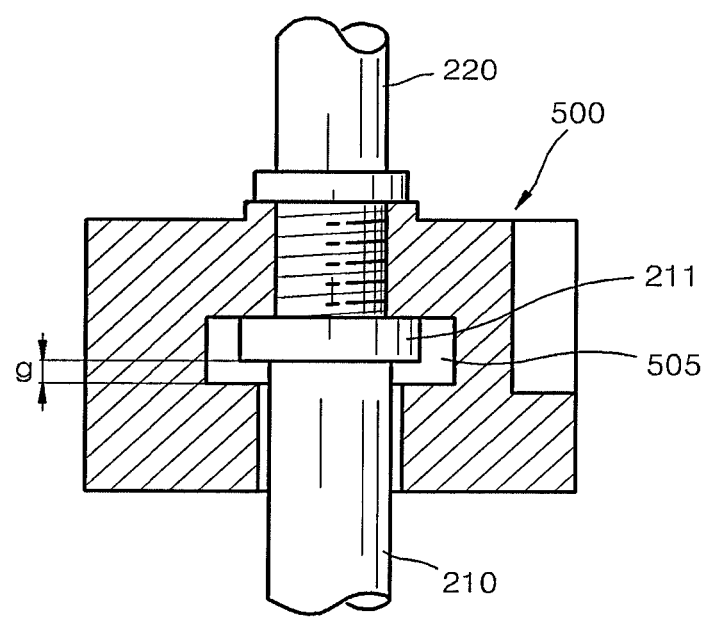
Figure 11A:
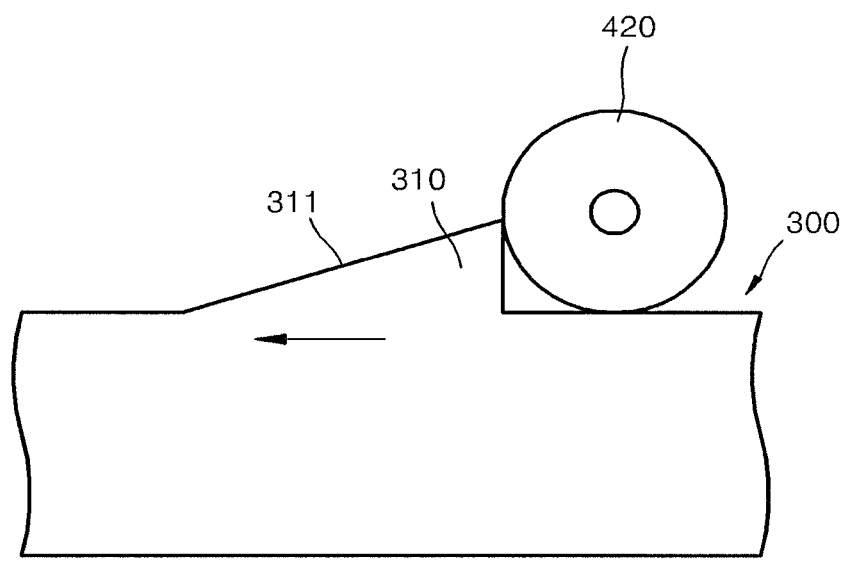
Figure 11B:
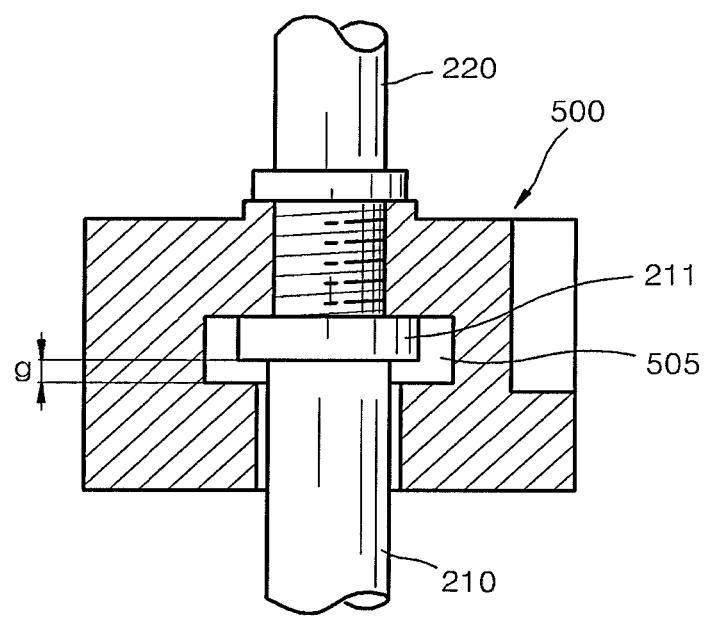
Figure 12:
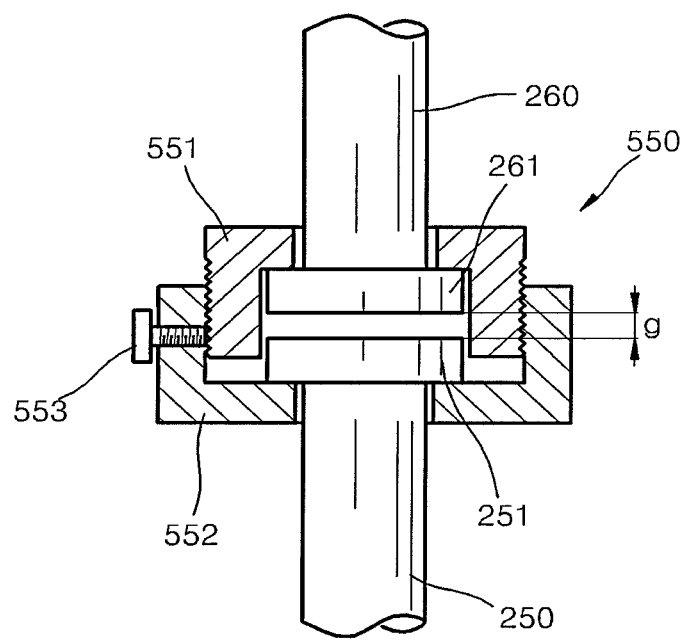
FIG. 12 is a cross-sectional view of elements of a valve impact type dispensing pump according to another embodiment of the present invention.

FIG. 4 is a cross-sectional view taken along a line IV-IV of the valve impact type dispensing pump of FIG. 1, FIGS. 5 through 11A and 11B are schematic views for explaining an operation of the valve impact type dispensing pump of FIG. 1, and FIG. 12 is a cross-sectional view of elements of a valve impact type dispensing pump according to another embodiment of the present invention.

Referring to FIG. 4, the liquid stored in the external syringe flows to the reservoir 112 of the valve body 110 via the inlet path 111 under uniform pressure.

If the motor 910 operates in this state, the motor 910 rotates with the driving pulley 920, and the driven pulley 940 that is connected to the driving pulley 920 via the timing belt 930, also rotates. The cam member 300 that is coupled to the driven pulley 940 rotates with the driven pulley 940.

If the cam member 300 rotates, the rollers 420 of the cam follower 400 roll along the inclined surfaces 311 of the cam protrusions 310, and the cam follower 400 ascends. Since the cam follower 400 is spline-coupled to the pump body 100, the cam follower 400 does not rotate but the rollers 420 roll along the inclined surfaces 311 of the cam protrusions 310 so that the cam follower 400 ascends. When the cam follower 400 ascends, the elastic member 600 is pressurized while applying the elastic force to the cam follower 400 in a downward direction. Due to the elastic force of the elastic member 600, the rollers 420 of the cam follower 400 are maintained in contact with a top surface of the cam member 300. The operating rod 220 coupled to the cam follower 400 also ascends with the gap member 500. After the operating rod 220 and the gap member 500 ascend by the gap distance g in a state where the valve rod 210 stops, the hanging groove 505 is caught in the hanging protrusion 211, and the valve rod 210 ascends with the operating rod 220 and is in the state illustrated in FIGS. 3 and 4. When the valve rod 210 ascends, the liquid flows in a space formed in the reservoir 112, and the space is filled with the liquid.

If the rollers 420 roll along the inclined surfaces 311 of the cam protrusions 310 and pass through tops of the inclined surfaces 311 of the cam protrusions 310, the rollers 420 roll down due to the elastic force of the elastic member 600. The cam follower 400, the operating rod 220, and the valve rod 210 descend with the rollers 420. From the instant that the operating rod 220 and the gap member 500 descend by the gap distance g in a state where the valve rod 210 stops and the hanging groove 505 is caught in the hanging protrusion 211, the operating rod 220 and the valve rod 210 descend together. The valve rod 210 descends, pressurizes the liquid filled in the space of the reservoir 112, and discharges the liquid via the discharge path 113.

If the cam member 300 rotates consecutively and the rollers 420 ascend and descend along the cam protrusions 310 repeatedly, the valve rod 210 ascends and descends consecutively while undergoing the above-described procedure so that the liquid may be discharged via the discharge path 113.

In the above liquid-pumping mechanism, the descending speed of the valve rod 210 greatly affects the discharge amount and discharge speed of the liquid. In order to adjust an accurate discharge amount, an inner diameter of the discharge path 113 may be relatively small. As the descending speed of the valve rod 210 increases, the liquid having high viscosity may be quickly dispensed via the discharge path 113 having a small inner diameter. In particular, when the viscosity of the liquid is high, if the descending speed of the valve rod 210 is not sufficiently high, due to resistance caused by viscosity and resistance of the discharge path 113, the liquid may not be discharged. However, like in embodiments of the present invention, the gap member 500 is used so that a liquid having high viscosity may be dispensed. In this way, by using the valve impact type dispensing pump according to embodiments of the present invention, the range of the liquid that may be dispersed, may be greatly increased.

The descending speed of the valve rod 210 may be rapidly improved by using a structure in which the gap member 500 and the valve rod 210 are moved relative to each other by the gap distance g and are interlocked with each other, as described above.

First, the relationship between the rotational speed of the cam member 300 and the descending speed of the operating rod 220 will be described with reference to FIGS. 5 and 6.

Figure 5:
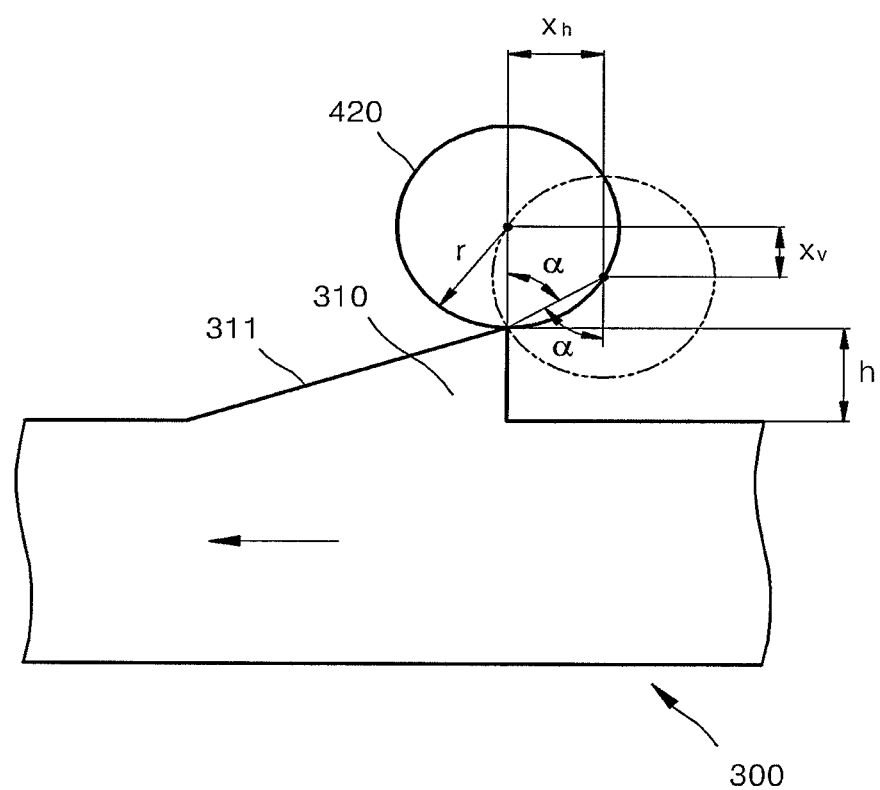
FIGS. 5, 6, 7A, 7B, 8A, 8B, 9A, 9B, 10A, 10B, 11A and 11B are schematic views for explaining an operation of the valve impact type dispensing pump of FIG. 1.
Figure 6:
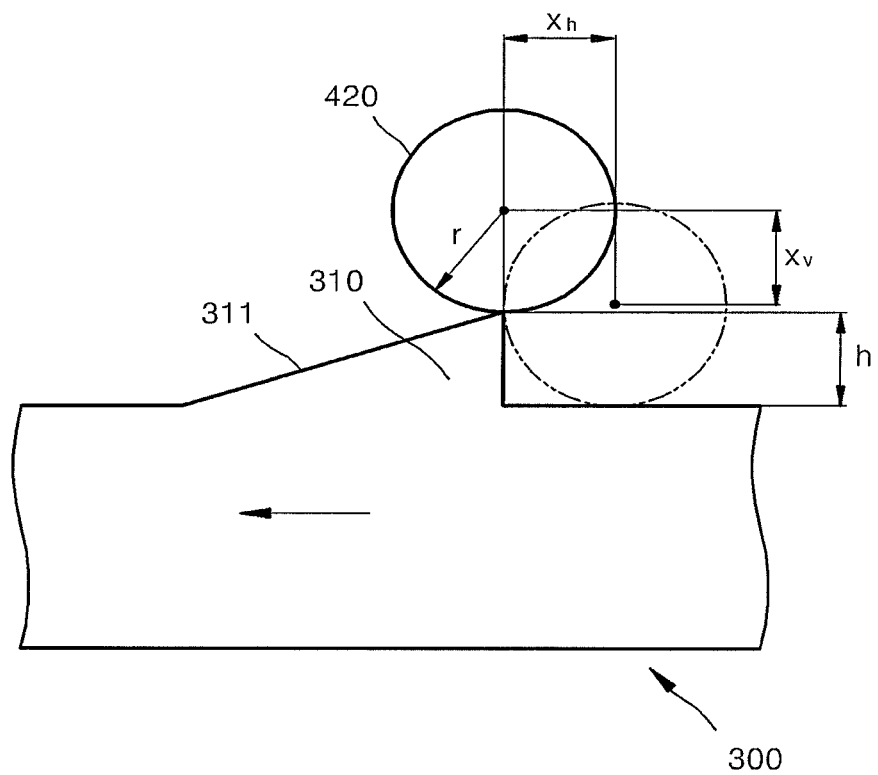

The operating rod 220 starts to descend in a state where the rollers 420 are disposed on the tops of the cam protrusions 310, as illustrated in FIG. 5. If the cam protrusions 310 are moved to the left by rotation of the cam member 300, the rollers 420 roll on the tops of the cam protrusions 310, and the operating rod 220 descends. The operating rod 220 descends until the rollers 420 contact the lowermost portion of the top surface of the cam member 300, as illustrated in FIG. 6.

When a radius of each roller 420 is r, a rotational angle of the roller 420 is α, a substantial rotational radius of the cam member 300 with respect to the roller 420 is R and a rotational angle of the cam member 300 is θ, a horizontal movement distance xh at which the rollers 420 are moved along a circumference of the cam member 300, may be expressed using Equation 1:

$$x_h = r \sin \alpha = R\theta \qquad (1).$$

A distance xv at which the rollers 420 descend from the tops of the cam protrusions 310 in the vertical direction may be expressed using Equation 2:

$$x_v = r - r \cos \alpha \qquad (2)$$

The horizontal movement distance xh of the rollers 420 obtained in Equation 1 may be differentiated with respect to time, as shown in Equation 3, in order to calculate a horizontal movement speed of the rollers 420:

$$\dot{x}_h = r \cos \alpha \dot{\alpha} = R\dot{\theta} \qquad (3)$$

Equation 3 will be summarized as Equation 4:

$$\dot{\alpha} = \frac{R}{r} \cdot \frac{\dot{\theta}}{\cos \alpha}. \qquad (4)$$

Equation 2 may be differentiated with respect to time and Equation 4 is substituted for Equation 2 in order to calculate a speed at which the rollers 420 descend from the tops of the cam protrusions 310 in the vertical direction, as shown in Equation 5:

$$\dot{x}_v = r \sin \alpha \cdot \dot{\alpha} = r \sin \alpha \cdot \frac{R}{r} \cdot \frac{\dot{\theta}}{\cos \alpha} = R\dot{\theta}\tan\alpha. \qquad (5)$$

According to the above Equation 5, the descending speed of the rollers 420 and the operating rod 220 are proportional to tan α. If the rotational speed of the cam member 300 is maintained constant by a motor, the descending speed of the operating rod 220 is substantially determined by tan α. When α corresponding to the rotational speed of the rollers 420 is 0, tan α starts from 0 and increases rapidly as α increases. As a result, when the rollers 420 approach the lowermost portion of the top surface of the cam member 300 compared to the case that the rollers 420 are moved around the cam protrusions 310, the operating rod 220 descends at much higher speed. According to embodiments of the present invention, the descending speed of the valve rod 210 is rapidly improved using a change of the descending speed of the operating rod 220. A detailed operating procedure thereof will be described as below.

Figure 7A:
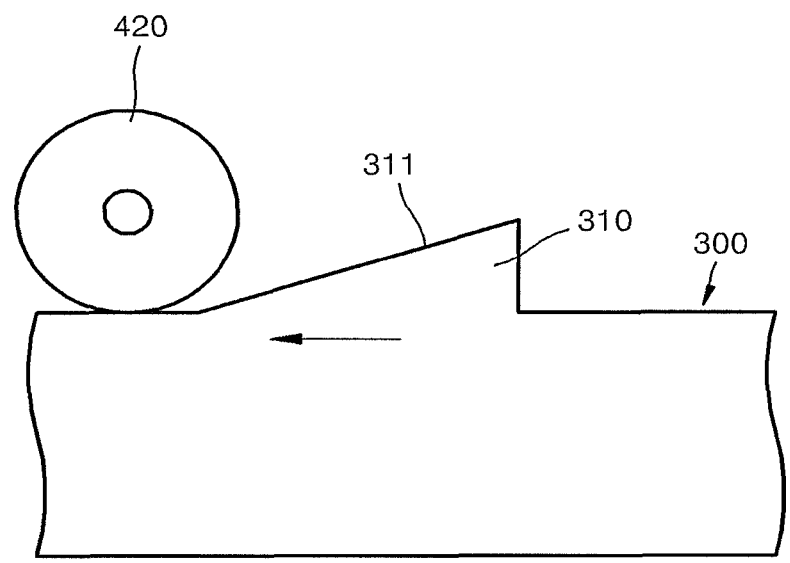
Figure 7B:
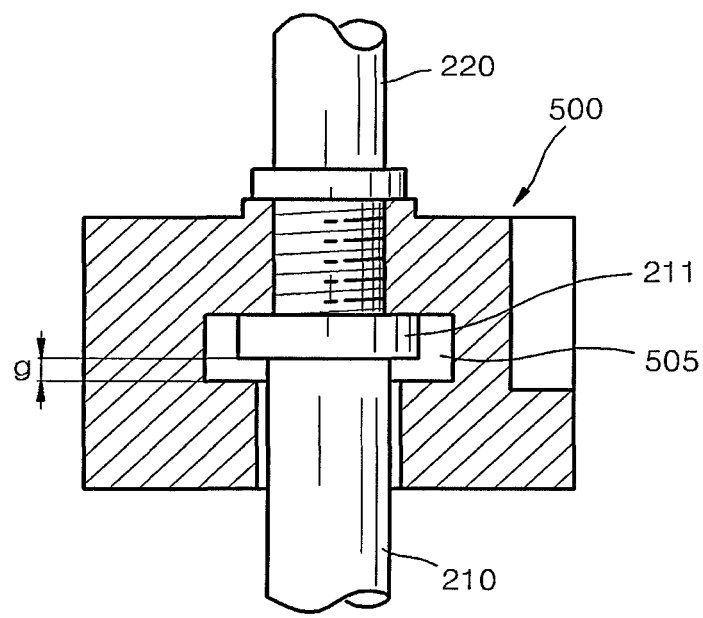

First, as illustrated in FIGS. 7A and 7B, the case that the operating rod 220 and the valve rod 210 descend altogether and the rollers 420 contact the lowermost portion of the top surface of the cam member 300, will be described. The top surface of the valve rod 210 and the bottom surface of the gap member 500 contact each other, as illustrated in FIG. 7B.

Figure 8A:
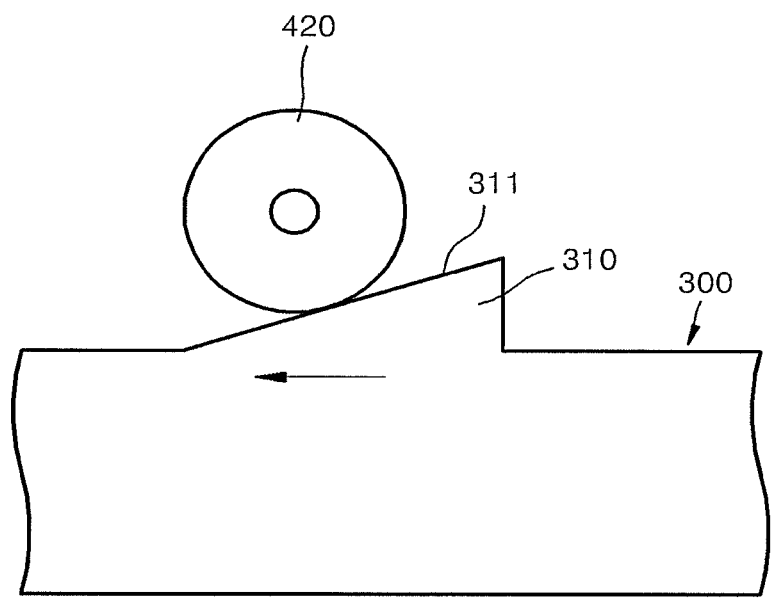
Figure 8B:
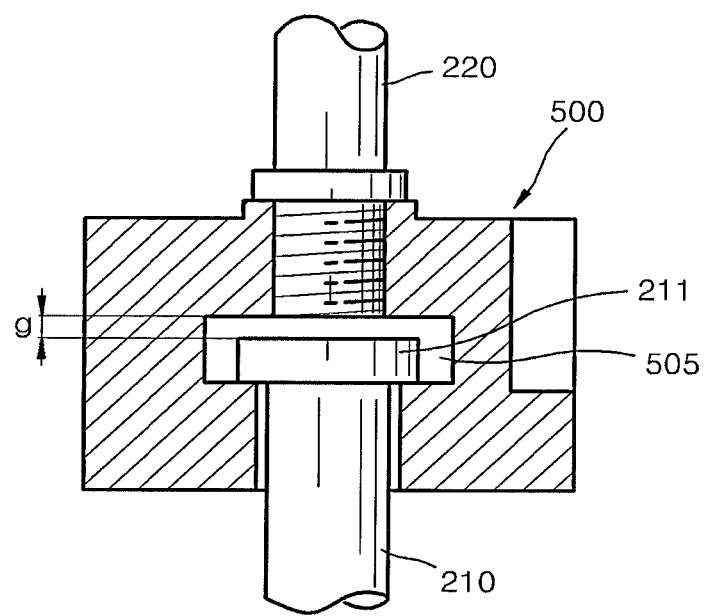

If the cam member 300 rotates in this state, the rollers 420 ascend, as illustrated in FIG. 8A. The operating rod 220 that is connected to the rollers 420 ascends together. While the operating rod 220 ascends by the gap distance g, the valve rod 210 stops as illustrated in FIG. 8B.

Figure 9A:
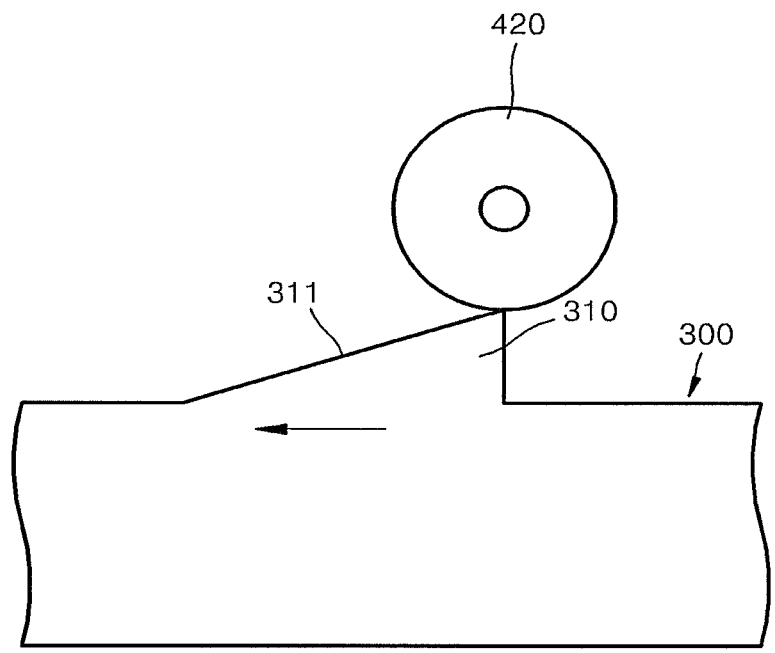
Figure 9B:
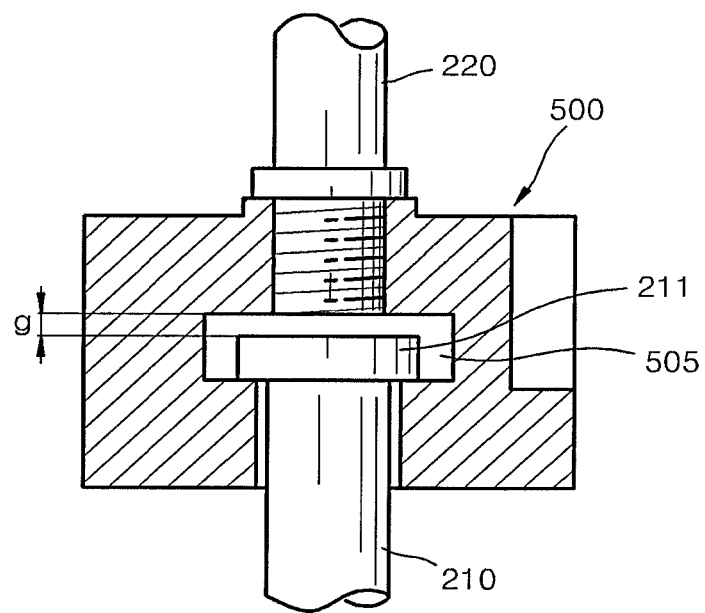

If the operating rod 220 ascends by the gap distance g or higher, the hanging groove 505 of the gap member 500 and the hanging protrusion 211 of the valve rod 210 are engaged in each other, and the operating rod 220 and the valve rod 210 ascend together, as illustrated in FIGS. 9A and 9B.

If the rollers 420 starts to descend from the tops of the cam protrusions 420, as illustrated in FIGS. 10A and 10B, while the operating rod 220 is first moved by the gap distance g, only the operating rod 220 descends in a state where the valve rod 210 stops, as illustrated in FIG. 10B. In this way, while the operating rod 220 is moved at a relatively low speed within the range of the gap distance g, only the operating rod 220 descends, and the valve rod 210 does not descend.

If the rollers 420 and the operating rod 220 are moved by the gap distance g and ascend to some degree, the gap member 500 impacts the valve rod 210 downwards and pressurizes the valve rod 210 downwards, as illustrated in FIGS. 11A and 11B. The rollers 420, the operating rod 220, the gap member 500, and the valve rod 210 descend at higher speed than in an area of the gap distance g.

As described above with reference to FIGS. 5 and 6, the descending speed of the rollers 420 increases in proportion to tan α as the rotational angle α of the rollers 420 with respect to the tops of the cam protrusions 310 increases compared to in an initial stage. That is, as the rollers 420 descend from the tops of the cam protrusions 310, the descending speed of the rollers 420 increases rapidly. In the valve impact type dispensing pump according to embodiments of the present invention, in a state where only the rollers 420 and the operating rod 220 descend in the area of the gap distance g due to the gap member 500 and the descending speed of the operating rod 220 increases, the gap member 500 impacts the valve rod 210 and allows the valve rod 210 to descend at high speed.

If there is no gap member 500 and the operating rod 220 and the valve rod 210 are fixed to each other, the valve rod 210 starts from the descending speed of 0 to a final speed together with the operating rod 220. However, by using the gap member 500 according to embodiments of the present invention, after only the operating rod 220 is moved and its descending speed increases in a state where the vale rod 210 stops, the gap member 500 collides with the valve rod 210 at high speed and allows the valve rod 210 to descend. A liquid having high viscosity may be easily and quickly dispensed according to this principle.

The following Table 1 shows comparison of descending speeds of the valve rod 210 with respect to several gap distances g that are calculated using the gap member 500. When the cam member 300 rotates with 1000 rpm (θ), the radius r of the roller 420 is 5 mm, the substantial rotational radius R of the cam member 300 with respect to a center of the roller 420 is 13 mm and the height h of the cam protrusions 310 is 2 mm, the descending speeds of the valve rod 210 with respect to the gap distances g are summarized as the following Table 1. As shown in Table 1, even when a gap distance g of 0.3 mm is set to the height h of 2 mm of the cam protrusions 310, the average descending speed of the valve rod 210 may be increased by 40% or higher compared to the case that the gap distance g is 0.

TABLE 1

| Gap distance g (mm) | Distance at which valve rod 210 descends (mm) | Horizontal circumferential distance at which rollers 420 roll within gap distance g (mm) | Circumferential distance at which rollers 420 roll in a range where valve rod 210 descends (mm) | Total time while valve rod 210 descends (usec) | Average descending speed of valve rod 210 (mm/sec) |
|---|---|---|---|---|---|
| 0.0 | 2.0 | 0.00 | 4.00 | 2938 | 680.7 |
| 0.3 | 1.7 | 1.71 | 2.29 | 1685 | 1008.8 |
| 0.6 | 1.4 | 2.37 | 1.63 | 1191 | 1172.8 |
| 0.9 | 1.1 | 2.86 | 1.14 | 836 | 1315.7 |
| 1.2 | 0.8 | 3.25 | 0.75 | 551 | 1451.4 |

The following Table 2 shows calculation of descending speeds of the valve rod 210 when only the radius of the roller 420 is changed to 8 mm on the above-described same conditions.

TABLE 2

| Gap distance g (mm) | Distance at which valve rod 210 descends (mm) | Horizontal circumferential distance at which rollers 420 roll within gap distance g (mm) | Circumferential distance at which rollers 420 roll in a range where valve rod 210 descends (mm) | Total time while valve rod 210 descends (usec) | Average descending speed of valve rod 210 (mm/sec) |
|---|---|---|---|---|---|
| 0.0 | 2.0 | 0.00 | 5.29 | 3887 | 514.5 |
| 0.3 | 1.7 | 2.17 | 3.12 | 2293 | 741.5 |
| 0.6 | 1.4 | 3.04 | 2.25 | 1654 | 846.4 |
| 0.9 | 1.1 | 3.69 | 1.61 | 1179 | 933.0 |
| 1.2 | 0.8 | 4.21 | 1.08 | 791 | 1011.0 |

Even in the above case, the descending speed of the valve rod 210 may be increased by 40% or higher only by setting the gap distance g of 0.3 mm compared to the case that there is no gap distance g. When the gap distance g is set to 1.2 mm, the descending speed of the valve rod 210 may be increased by about 100%.

Since the momentum and kinetic energy of the valve rod 210 are proportional to a descending speed of the valve rod 210 and a square of the descending speed, the liquid may be dispensed at much higher speed compared to the related art. In particular, a liquid having high viscosity may be dispensed by a sufficient force via the discharge path 113 having a relatively small inner diameter.

The above-described gap distance g may be greater than 0 and less than the height h of the cam protrusions 310. If the gap distance g is 0, there is no difference between the present invention and the related art. If the gap distance g is greater than the height h of the cam protrusions 310, the operating rod 220 cannot pressurize the valve rod 210.

The height h of the cam protrusions 310 may be less than a value that is obtained by adding the length of the reservoir 112 to the gap distance g. If not, the valve 210 may be excluded from the reservoir 112 of the valve body 110.

Although embodiments of the present invention have been described as above, the scope of the present invention is not limited to the above-described embodiments.

For example, the gap member 500 is coupled to the operating rod 220, and the valve rod 210 is moved relative to the gap member 500 by the gap distance g but vice versa. The gap member 500 may be coupled to the valve rod 210, and the operating rod 220 may be moved relative to the gap member 500 by the gap distance g while interfering with each other. In this case, the hanging protrusion 211 may be formed on the operating rod 220 and is caught in the hanging groove 505 of the gap member 500.

Alternatively, the gap member 500 may be modified in various ways in which the valve rod 210 and the operating rod 220 may be moved relative to each other to extend within the range of the gap distance g. For example, the gap member 550 having a shape of FIG. 12 may be used. The gap member 550 may be configured in such a way that hanging protrusions 251 and 261 are disposed on a valve rod 250 and an operating rod 260, respectively, and the hanging protrusion 251 of the valve rod 250 and the hanging protrusion 261 of the operating rod 260 may be caught in the gap member 550. In this case, the gap member 550 is configured in such a way that an upper member 551 and a lower member 552 of the gap member 550 may be screw-coupled to each other, the hanging protrusion 261 of the operating rod 260 may be caught in the upper member 551 and the hanging protrusion 251 of the valve rod 250 may be caught in the lower member 552. The upper member 551 and the lower member 552 that are screw-coupled to each other, rotate relative to each other so that the gap distance g may be adjusted. When the gap distance g is set, relative rotation of the upper member 551 and the lower member 552 is prevented by a tightening bolt 553 so that the gap distance g may be fixed. Also, the upper member 551 of the gap member 550 may be screw-coupled to the operating rod 260, or the lower member 552 of the gap member 550 may be screw-coupled to the valve rod 250.

In FIGS. 1 and 2, eight cam protrusions 310 and two rollers 420 are disposed. However, the number of cam protrusions 310 and the number of rollers 420 may be diverse. The shape of the cam protrusions 310 may vary according to their inclined angles and curvatures of inclined surfaces.

As described above, in a valve impact type dispensing pump according to embodiments of the present invention, a liquid may be dispensed at high speed.

Also, the valve impact type dispensing pump according to the present invention may dispense a liquid having high viscosity at high speed due to a fast descending speed of a valve rod.

While embodiments of the present invention have been particularly shown and described, it will be understood by those of ordinary skill in the art that various changes in form and details may be made therein without departing from the spirit and scope of the present invention as defined by the following claims.

What is claimed is:

1. A method of dispensing liquid, the method comprising:
   providing a liquid dispensing pump which comprises:
   a cam rotatable about a rotational axis and comprising a cam surface around the rotational axis,
   a cam follower biased toward the cam surface and configured to travel along the cam surface for reciprocating movement along a first direction,
   an operation rod coupled to the cam follower and configured to generate a stroke along the first direction based on the reciprocating movement of the cam follower,
   a valve assembly comprising a valve and a nozzle, and
   a gap member integrated with the operation rod and coupled to the valve with a gap therebetween such that during a first part of the stroke the gap member is movable relative to the valve that does not transfer the stroke of the operation rod to the valve and that during a second part of the stroke following the first part the gap member contacts the valve to transfer the stroke of the operation rod to move the valve toward the nozzle;
   supplying liquid to the valve assembly; and
   rotating the cam about the rotational axis to cause the cam follower to travel along the cam surface for reciprocating movement thereof along the first direction, wherein as the gap member moves in the first direction toward the nozzle, the gap member first moves relative to the valve within a distance of the gap along the first direction such that the movement of the gap member does not transfer any force to the valve and subsequently the gap member contacts the valve and pushes the valve toward the nozzle.

2. The method of claim 1, wherein the gap member comprises a gap member surface and the valve comprises a valve surface, and the gap member surface moves toward the valve surface during the first part of the stroke until the gap member surface contacts the valve surface.

3. The method of claim 2, wherein during the second part of the stroke the gap member surface and the valve surface maintain contacting each other such that the gap member pushes the valve toward the nozzle.

4. The method of claim 2, wherein the operation rod is secured to the gap member with no relative motion of the operation rod relative to the gap member.

5. The method of claim 2, wherein the gap member comprises a second gap member surface and the valve comprises a second valve surface, wherein during the second part of the stroke, the second gap member surface does not contact the second valve surface.

6. The method of claim 5, wherein the second valve surface faces away from the valve surface.

7. The method of claim 5, wherein the second gap member surface contacts the second valve surface while the valve moves away from the nozzle.

8. The method of claim 5, wherein the distance of the gap between the gap member surface and the valve surface along the first direction has its maximum value when the second gap member surface contacts the second valve surface.

9. The method of claim 8, further comprising adjusting the maximum value.

10. The method of claim 2, wherein the cam surface comprises an ascending portion and a descending portion, wherein the gap member moves toward the nozzle along the first direction as the cam follower travels over the descending portion, wherein during the cam follower's traveling over the descending portion the gap member surface moves toward the valve surface and then contacts the valve surface to push the valve toward the nozzle.

11. The method of claim 2, wherein the cam surface comprises an ascending portion and a descending portion, wherein the gap member moves away from the nozzle along the first direction as the cam follower travels on the ascending portion, wherein the cam follower's traveling on the ascending portion the gap member surface does not contact the valve surface.

12. The method of claim 1, wherein the distance of the gap along the first direction is smaller than the stroke of the cam follower along the first direction.

13. A method of dispensing liquid, the method comprising:
   providing a liquid dispensing pump which comprises:
      a cam rotatable about a rotational axis and comprising a cam surface around the rotational axis,
      a cam follower biased toward the cam surface and configured to travel along the cam surface for reciprocating movement along a first direction,
      an operation rod coupled to the cam follower and configured to generate a stroke along the first direction based on the reciprocating movement of the cam follower,
      a valve assembly comprising a valve and a nozzle, and
      a gap member interconnecting the operation rod and the valve with a gap between the operation rod and the valve such that during a first part of the stroke the operation rod is movable relative to the valve that does not transfer the stroke of the operation rod to the valve and that during a second part of the stroke following the first part the operation rod contacts the valve to transfer the stroke of the operation rod to move the valve toward the nozzle,
      wherein the operation rod the operation rod surface at its one end and the valve comprises a valve surface, and the operation rod surface moves toward the valve surface during the first part of the stroke until the operation rod surface contacts the valve surface;
   supplying liquid to the valve assembly; and
   rotating the cam about the rotational axis to cause the cam follower to travel along the cam surface for reciprocating movement thereof along the first direction,
      wherein as the operation rod moves in the first direction toward the nozzle, the operation rod first moves relative to the valve within a distance of the gap along the first direction such that the movement of the operation rod does not transfer any force to the valve and subsequently the operation rod contacts the valve and pushes the valve toward the nozzle.

14. A method of making an electronic device, the method comprising:
   providing an intermediate electronic device comprising a surface on which to mount an electronic component;
   dispensing liquid on the surface of the intermediate electronic device, wherein dispensing liquid is performed using the method of claim 1; and
   placing the electronic component over the surface, wherein the liquid is disposed between the electronic component and the surface.

15. The method of claim 14, further comprising curing the liquid, thereby filling space between the surface and the electronic component by the cured liquid and bonding the surface and the electronic component.

16. The method of claim 14, wherein the gap member comprises a gap member surface and the valve comprises a valve surface, and the gap member surface moves toward the valve surface during the first part of the stroke until the gap member surface contacts the valve surface.

17. The method of claim 16, wherein the gap member comprises a second gap member surface and the valve comprises a second valve surface, wherein during the second part of the stroke, the second gap member surface does not contact the second valve surface.

18. The method of claim 17, wherein the second gap member surface contacts the second valve surface while the valve moves away from the nozzle.

19. The method of claim 16, wherein the cam surface comprises an ascending portion and a descending portion, wherein the gap member moves toward the nozzle along the first direction as the cam follower travels over the descending portion, wherein during the cam follower's traveling over the descending portion the gap member surface moves toward the valve surface and then contacts the valve surface to push the valve toward the nozzle.

20. The method of claim 14, wherein the distance of the gap along the first direction is smaller than the stroke of the cam follower along the first direction.

* * * * *